(12) United States Patent
Shu et al.

(10) Patent No.: US 11,581,386 B2
(45) Date of Patent: Feb. 14, 2023

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Min Shu, Hubei (CN); Jing Yuan, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 218 days.

(21) Appl. No.: 16/978,702

(22) PCT Filed: Jul. 21, 2020

(86) PCT No.: PCT/CN2020/103161
§ 371 (c)(1),
(2) Date: Sep. 6, 2020

(87) PCT Pub. No.: WO2021/258462
PCT Pub. Date: Dec. 30, 2021

(65) Prior Publication Data
US 2021/0408207 A1 Dec. 30, 2021

(30) Foreign Application Priority Data
Jun. 24, 2020 (CN) .......................... 202010592327.8

(51) Int. Cl.
*H01L 27/32* (2006.01)
*H01L 51/52* (2006.01)
*H05K 1/18* (2006.01)

(52) U.S. Cl.
CPC ........ *H01L 27/3276* (2013.01); *H01L 27/323* (2013.01); *H01L 51/5253* (2013.01); *H05K 1/189* (2013.01)

(58) Field of Classification Search
CPC ............... H01L 27/3276; H01L 27/323; H01L 51/5253; H01L 27/3258; H05K 1/189
See application file for complete search history.

(56) References Cited

U.S. PATENT DOCUMENTS

2018/0315951 A1* 11/2018 Seong ................. H01L 27/3276

FOREIGN PATENT DOCUMENTS

| CN | 106711181 A | 5/2017 |
|---|---|---|
| CN | 108258011 A | 7/2018 |

(Continued)

*Primary Examiner* — Kyoung Lee
(74) *Attorney, Agent, or Firm* — Pv Ip PC; Wei Te Chung; Ude Lu

(57) ABSTRACT

A display panel and a display device are provided, and the display panel includes a bonding area, a thin film transistor functional layer, and a conductive structure layer disposed in order. A part of the thin film transistor functional layer disposed on the bonding area includes a first inorganic layer and a plurality of signal lines. The conductive structure layer includes a second inorganic layer and a conductive layer disposed in order, and a part of the second inorganic layer disposed in the bonding area is disposed on the signal line and is directly disposed on the first inorganic layer.

20 Claims, 3 Drawing Sheets

(56) References Cited

FOREIGN PATENT DOCUMENTS

| | | |
|---|---|---|
| CN | 108807471 A | 11/2018 |
| CN | 109728041 A | 5/2019 |
| CN | 110970484 A | 4/2020 |
| CN | 111180486 A | 5/2020 |
| KR | 20160066363 A | 6/2016 |

* cited by examiner

DISPLAY PANEL AND DISPLAY DEVICE

CROSS-REFERENCES TO RELATED APPLICATIONS

This application is a national stage of PCT application NO. PCT/CN2020/103161, filed on Jul. 21, 2020, which claims foreign priority to Chinese Patent Application NO. 202010592327.8, filed on Jun. 24, 2020, the disclosure of which is incorporated herein by reference.

BACKGROUND OF INVENTION

Field of Invention

The present disclosure relates to the field of display technology, and more particularly, to a display panel and a display device.

Description of Prior Art

Direct on-cell touch (DOT) is an in-cell touch technology that directly makes touch circuits on the surface of the packaging glass. When compared to external touch technology, display panels made by DOT technology have gradually become a mainstream trend of touch technology due to their narrow frame, thin, high transmittance, etc.

After the DOT process is finished, the structure of display panel bonding area is a welding pad formed by patterning the metal conductive layer during the DOT process overlap the metal circuit in the array substrate. However, since the film structure of the non-metal area between the welding pads is a direct contact between the organic layer and the inorganic layer, the adhesion between the layers of the non-metal area is poor, which makes the flexible circuit board and the welding pad easily to fall off after bonding, and greatly reduces yield of the display panel.

SUMMARY OF INVENTION

A display panel and a display device are provided, so as to solve the technical problems that the flexible circuit boards are easily to fall off after bonding due to poor adhesion between the layers in the non-metal area of the bonding area.

In one embodiment, a display panel comprises: a bonding area, and the bonding area is configured to bind and connect with a flexible circuit board;

a thin film transistor functional layer, and a part of the thin film transistor functional layer disposed in the bonding area comprises a first inorganic layer and a plurality of signal lines disposed on the first inorganic layer; and a conductive structure layer, and the conductive structure layer is disposed on the signal line, the conductive structure layer comprises a second inorganic layer and a conductive layer disposed in order, and a part of the second inorganic layer located in the bonding area is disposed on the signal line and is directly disposed on the first inorganic layer, and a part of the conductive layer located in the bonding area comprises a plurality of binding components, and each binding component is correspondingly disposed above the signal line, and the binding component is electrically connected to the signal line, and an interface between a part of the second inorganic layer disposed in the bonding area and the first inorganic layer is a rough surface.

In one embodiment, in the display panel, a via hole is defined on a part of the second inorganic layer corresponding to the signal line, and the via hole exposes the signal line, and the binding component is electrically connected to the signal line through the via hole.

In one embodiment, a display panel comprises:

a bonding area, and the bonding area is configured to bind and connect with a driving component;

a thin film transistor functional layer, and a part of the thin film transistor functional layer disposed in the bonding area comprises a first inorganic layer and a plurality of signal lines disposed on the first inorganic layer; and a conductive structure layer, and the conductive structure layer is disposed on the signal line, the conductive structure layer comprises a second inorganic layer and a conductive layer disposed in order, and a part of the second inorganic layer located in the bonding area is disposed on the signal line and is directly disposed on the first inorganic layer, and a part of the conductive layer located in the bonding area comprises a plurality of binding components, and each binding component is correspondingly disposed above the signal line, and the binding component is electrically connected to the signal line; and an interface between a part of the second inorganic layer disposed in the bonding area and the first inorganic layer is a rough surface.

In one embodiment, the display panel further comprises a display area, and a part of the conductive structure layer disposed in the display area comprises a plurality of bridges, the second inorganic layer comprises a first sub-inorganic layer and a second sub-inorganic layer disposed in order, and each bridge is disposed between the first sub-inorganic layer and the second sub-inorganic layer, and a part of the conductive layer disposed in the display area further comprises a plurality of first touch electrodes and a plurality of second touch electrodes disposed on the same level layer, and adjacent first touch electrodes are electrically connected to each other through the bridge; and the binding component and the first touch electrode are disposed on the same level layer.

In one embodiment, the display panel further comprises an organic light-emitting layer and a packaging layer disposed on the thin film transistor functional layer in order, and the first inorganic layer is disposed on the packaging layer.

In one embodiment, in the display panel, the first inorganic layer comprises a substrate, a buffer layer, a gate insulating layer, and an interlayer dielectric layer disposed in order, and a part of the second inorganic layer disposed in the bonding area covers the interlayer dielectric layer.

In one embodiment, in the display panel, the thin film transistor functional layer comprises an active layer, a gate metal layer, a first source/drain metal layer, and a second source/drain metal layer disposed in order; and the active layer is disposed on the buffer layer, the gate insulating layer is disposed on the active layer, the gate metal layer is disposed on the gate insulating layer, the interlayer dielectric layer is disposed on the gate metal layer, and the first source/drain metal layer is disposed on the interlayer dielectric layer; and the signal line comprises a first sub-signal line and a second sub-signal line disposed on the first inorganic layer in order, the first sub-signal line and the first source/drain metal layer are disposed on the same level layer, and the second sub-signal line and the second source/drain metal layer are disposed on the same level layer.

In one embodiment, in the display panel, a via hole is defined on a part of the second inorganic layer corresponding to the signal line, and the via hole exposes the signal line, and the binding component is electrically connected to the signal line through the via hole.

In one embodiment, the display panel further comprises a conductive glue, the driving component comprises a plurality of connection terminals, and the conductive glue is disposed between the connection terminals and the binding components; and a groove is formed on the binding component, and the connection terminal comprises a convex part that matches with the groove.

In one embodiment, in the display panel, the driving component is a flexible circuit board.

A display device comprises a display panel, and the display panel comprises:

a bonding area, and the bonding area is configured to bind and connect with a driving component;

a thin film transistor functional layer, and the thin film transistor functional layer disposed in the bonding area comprises a first inorganic layer and a plurality of signal lines disposed on the first inorganic layer; and a conductive structure layer, and the conductive structure layer is disposed on the signal line, the conductive structure layer comprises a second inorganic layer and a conductive layer disposed in order, and a part of the second inorganic layer located in the bonding area is disposed on the signal line and is directly disposed on the first inorganic layer, and a part of the conductive layer located in the bonding area comprises a plurality of binding components, and each binding component is correspondingly disposed above the signal line, and the binding component is electrically connected to the signal line.

In one embodiment, in the display device, an interface between a part of the second inorganic layer disposed in the bonding area and the first inorganic layer is a rough surface.

In one embodiment, the display device further comprises a display area, and a part of the conductive structure layer disposed in the display area comprises a plurality of bridges, the second inorganic layer comprises a first sub-inorganic layer and a second sub-inorganic layer disposed in order, and each bridge is disposed between the first sub-inorganic layer and the second sub-inorganic layer, and a part of the conductive layer disposed in the display area further comprises a plurality of first touch electrodes and a plurality of second touch electrodes disposed on the same level layer, and adjacent first touch electrodes are electrically connected to each other through the bridge; and the binding component and the first touch electrode are disposed on the same level layer.

In one embodiment, the display device further comprises an organic light-emitting layer and a packaging layer disposed on the thin film transistor functional layer in order, and the first inorganic layer is disposed on the packaging layer.

In one embodiment, in the display device, the first inorganic layer comprises a substrate, a buffer layer, a gate insulating layer, and an interlayer dielectric layer disposed in order, and a part of the second inorganic layer disposed in the bonding area covers the interlayer dielectric layer.

In one embodiment, in the display device, the thin film transistor functional layer comprises an active layer, a gate metal layer, a first source/drain metal layer, and a second source/drain metal layer disposed in order; and the active layer is disposed on the buffer layer, the gate insulating layer is disposed on the active layer, the gate metal layer is disposed on the gate insulating layer, the interlayer dielectric layer is disposed on the gate metal layer, and the first source/drain metal layer is disposed on the interlayer dielectric layer; and the signal line comprises a first sub-signal line and a second sub-signal line disposed on the first inorganic layer in order, the first sub-signal line and the first source/drain metal layer are disposed on the same level layer, and the second sub-signal line and the second source/drain metal layer are disposed on the same level layer.

In one embodiment, in the display device, a via hole is defined on a part of the second inorganic layer corresponding to the signal line, and the via hole exposes the signal line, and the binding component is electrically connected to the signal line through the via hole.

In one embodiment, in the display device, a via hole is defined on a part of the second inorganic layer corresponding to the signal line, and the via hole exposes the signal line, and the binding component is electrically connected to the signal line through the via hole.

In one embodiment, in the display device, the driving component is a flexible circuit board.

As compared to the display panel in the prior art, the display panel of the present invention is formed by removing the organic layer of the non-conductive layer in the bonding area, so that the second inorganic layer of the non-conductive layer directly contacts with the first inorganic layer of the thin film transistor functional layer in the non-conductive layer. Due to the good adhesion between the inorganic layers, the adhesion between the non-conductive layers is enhanced, thereby reducing the probability of falling off after the flexible circuit board and the binding component are bound, and improving the product yield of the display panel.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

DETAILED DESCRIPTION OF PREFERRED EMBODIMENTS

Figure 1:
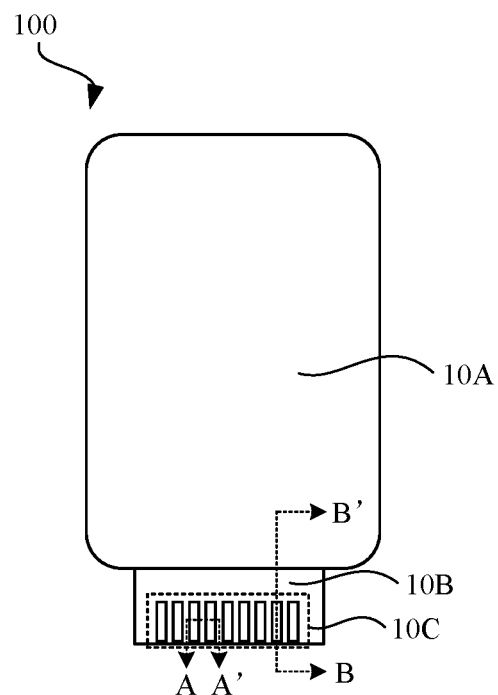
FIG. 1 is a schematic diagram of a planar structure of a display panel according to one embodiment of the present invention
Figure 2:
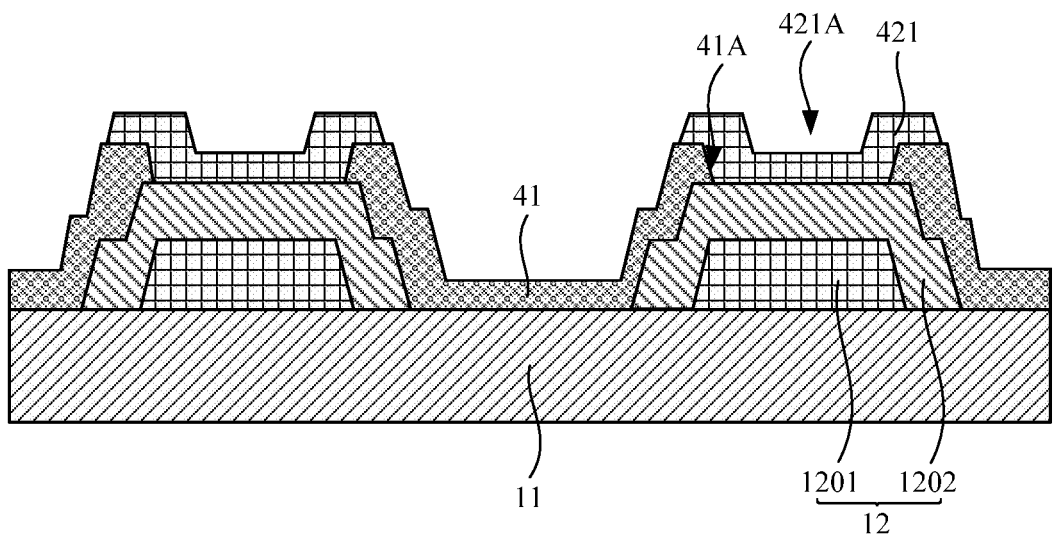
FIG. 2 is a schematic cross-sectional structure view along line AA' in FIG. 1.
Figure 3:
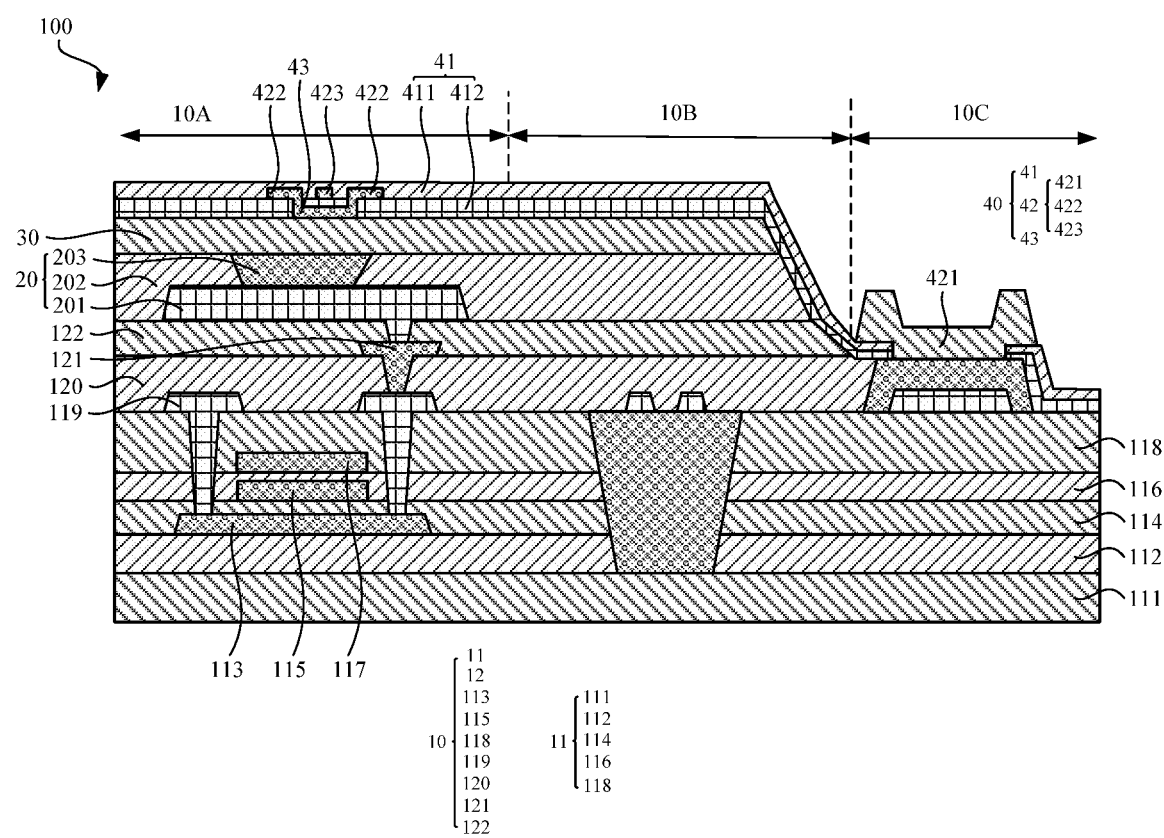
FIG. 3 is a schematic cross-sectional structure view along line BB' in FIG. 1.

Referring to the brief description of drawings and the component number corresponding to the component, the following description is based on a specific embodiment used in the present invention, which should not be considered as limiting other embodiments of the invention that are not described in detailed herein. The specific embodiments are not intended to limit the scope of the invention, and a person skilled in the art may make various modifications without departing from the spirit and scope of the invention. The scope of the present invention is determined by claims.

In the description of the present invention, it is to be understood that the terms "center," "longitudinal," "lateral," "length," "width," "thickness," "upper," "lower," "front," "back," "left," "right," "vertical," "horizontal," "top," "bottom," "inside," "outside," "clockwise," "counterclockwise,"

etc., indicated as orientation or positional relationship are based on the orientation or positional relationship shown in the drawings, they merely intend to illustrate the present invention and simplify the description, but are not to be as indicating or implying specific devices or elements having specific orientation, specific orientation structure and operating. Therefore, it cannot be understood as limitations. Moreover, the terms "first" and "second" are merely used for describing purposes, but are not to be conceived as indicating or implying a relative important or implicitly indicating specific technical feature numbers. Accordingly, the feature limitations of "first" or "second" may include one or more of the described features explicitly or implicitly. In the description of the present invention, the meaning of "a plurality of" is two or more, unless otherwise explicitly defined.

In the description of the present invention, it should be noted that, unless otherwise explicitly defined, the terms "installation," "adjacent" and "connection" are to be understood broadly, for example, it may be fixed connection, disassembly connection or integral connection; it may be mechanical connection, electrically connection or interconnection; it may be directly connection or indirectly connected through an intermediate medium; and it may be interconnection of two elements or interaction of two elements. A person skilled in the art can conceive the specific meanings of the above-mentioned terms in the present invention based on the specific situation.

In the present invention, unless otherwise specifically defined and defined, the first feature is disposed "on" or "under" the second feature, which means that the first feature directly contacts the second feature, and also the first feature is not in direct contact the second feature but through addition features between them. Moreover, the first feature is disposed "above," "on" and "upper" the second feature, which means that the first feature is directly or substantially above the second feature, or merely indicates that the first feature level is higher than the second feature. The first feature is "below," "under" and "underneath" the second feature, which means that the first feature is directly or substantially below the second feature, or merely indicates that the first feature level is less than the second feature.

The following disclosure provides many different embodiments or examples for implementing different structures of the present invention. In order to simplify the disclosure of the present invention, the components and arrangements of the specific examples are described below. Of course, they are merely examples and are not intended to limit the invention. In addition, the present invention may be repeated with reference numerals in the various examples, which are for the purpose of simplicity and clarity, and do not indicate the relationship between the various embodiments and/or arrangements discussed. Moreover, the present invention provides embodiments of various specific processes and materials, but a person skilled in the art may recognize the use of other processes and/or the use of other materials.

Referring to FIG. 1 to FIG. 4, the display panel 100 according to one embodiment of the present invention comprises a display area 10A, a bending area 10B, and a bonding area 10C. The bonding area 10C is disposed on one side of the bending area 10B away from the display area 10A. The bonding area 10C is configured to connect with the driving component 50. The display panel 100 comprises a thin film transistor functional layer 10, an organic light-emitting layer 20, a packaging layer 30, and conductive structure layer 40 disposed in order. A part of the thin film transistor functional layer 10 disposed in the bonding area 10C comprises a first inorganic layer 11 and a plurality of signal lines 12 disposed on the first inorganic layer 11. The conductive structure layer 40 is disposed on the signal line 12. The conductive structure layer 40 comprises a second inorganic layer 41 and a conductive layer 42 disposed in order. A part of the second inorganic layer 41 is located in the bonding area 10C and the part of the second inorganic layer 41 is disposed on the signal line 12, and the part of the second inorganic layer 41 is directly disposed on the first inorganic layer 11. A part of the conductive layer 42 is located in the bonding area 10C comprises a plurality of binding components 421. The binding component 421 is correspondingly disposed above the signal line 12, and the binding component 421 is electrically connected to the signal line 12.

Therefore, the display panel 100 according to one embodiment of the present invention removes the organic layer in the non-conductive layer in the bonding area 10C, so that the non-conductive layer structure is in direct contact with the second inorganic layer 41 in the conductive structure layer 40 and the first inorganic layer 11 in the thin film transistor functional layer 10, and due to good adhesion between the inorganic layers, adhesion between the non-conductive layers is enhanced, and reducing the probability of falling off after the driving component 50 and the binding component 421 are bound, and improving the product yield of the display panel. In one embodiment, the first inorganic layer 11 comprises a substrate 111, a buffer layer 112, a first gate insulating layer 114, a second gate insulating layer 116, and an interlayer dielectric layer 118 are disposed in order. A part of second inorganic layer 41 disposed in the bonding area 10C covers the interlayer dielectric layer 118.

The thin film transistor functional layer 10 comprises an active layer 113, a first gate metal layer 115, a second gate metal layer 117, a first source/drain metal layer 119, a first planarization layer 120, a second source/drain metal layer 121 and a second planarization layer 122 disposed in order. The active layer 113 is disposed on the buffer layer 112. The first gate insulating layer 114 is disposed on the active layer 113. The first gate metal layer 115 is disposed on the first gate insulating layer 114. The second gate insulating layer 116 is disposed on the first gate metal layer 115. The second gate metal layer 117 is disposed on the second gate insulating layer 116. The interlayer dielectric layer 118 is disposed on the second gate metal layer 117. The first source/drain metal layer 119 is disposed on the interlayer dielectric layer 118.

In one embodiment, the signal line 12 comprises a first sub-signal line 1201 and a second sub-signal line 1202 disposed on the first inorganic layer 11 in order. The first sub-signal line 1201 and the first source/drain metal layer 119 are disposed on the same level layer. The second sub-signal line 1202 and the second source/drain metal layer 121 are disposed on the same level layer.

In one embodiment, the first sub-signal line 1201 may be a data line, and the second sub-signal line 1202 may be a high-level signal line or a low-level signal line, and the specific type of first sub-signal line 1201 and the second sub-signal line are not specified.

It should be noted that, in one embodiment according to the present invention, a part of the first source/drain metal layer 119 disposed in the display area 10A comprises a source and a drain (not shown in the drawings), and a part of the source/drain metal layer 121 disposed in the display area 10A comprises a power signal line (not shown in the drawings), and the schematic structures of the first source/ drain metal layer 119 and the second source/drain metal layer 121 are provided, which are used to facilitate the description of the embodiments of the present invention, but should not be understood as a limitation of the present invention.

In addition, the expression "disposed on the same level layer" in the present invention indicates during the preparation process, the layer formed of the same material is patterned to obtain at least two different features, and at least two different features are disposed on the same level layer. For example, the first sub-signal line 1201 and the first source/drain metal layer 119 according to one embodiment in the present invention are obtained by patterning the same conductive layer, and the first sub-signal line 1201 and the first source/drain metal layer 119 are formed on the same level layer.

It should be noted that, in the prior art, after the thin film transistor functional layer is formed, a planarization layer is formed on the thin film transistor functional layer, and the organic light-emitting layer and the packaging layer are formed on a part of the planarization layer disposed in the display area and the bending area in order, and a part of the planarization layer in the bonding area is exposed to the outside. Since the material of the planarization layer is generally an organic photoresist material, and due to a part of the planarization layer disposed in the bonding area is exposed for a long period, it is very susceptible to water vapor intrusion and will damage the film. When the conductive structure layer is formed on the display area, the bending area and the bonding area, as the inorganic layer in the conductive structure layer in the bonding area is directly contact with the planarization layer, and the destruction of the substitution layer will cause the doping between the inorganic layer in the laminated layer and the conductive structure layer to be greatly reduced, and resulting a poor orientation between the layers in the non-conductive area of the bonding area, and when the driving component is combined with the binding component, is very easy to cause the driving device to fall off.

In one embodiment, by removing a part of the second planarization layer 122 disposed on the bonding area 10C, making the film structure in the non-conductive area of the bonding area 10C to have a direct contact between the inorganic layers, and may greatly enhance the adhesion between the non-conductive layers, and the problem of driving component 50 falling off after bonding is effectively avoided.

It should be noted that, a part of the first inorganic layer 11 disposed on the bending area 10B and a groove is formed (not shown in the drawings), and the groove is filled with an organic material, and the details are not described herein.

In one embodiment, the organic light-emitting layer 20 comprises an anode layer 201, a pixel definition layer 202, and a light emitting layer 203 disposed in order. In addition, the specific film structure of the packaging layer 30 can refer to the prior art, and the details are not described herein.

In one embodiment, a part of the conductive structure layer 40 disposed on the display area 10A comprises a plurality of bridges 43. The second inorganic layer 41 comprises a first sub-inorganic layer 411 and a second sub-inorganic layer 412 are disposed on the packaging layer 30 in order. The bridge 43 is disposed between the first sub-inorganic layer 411 and the second sub-inorganic layer 412. A part of the conductive layer 42 disposed on the display area 10A also comprises a plurality of first touch electrodes 422 and second touch electrodes 423 disposed on the same level layer.

It should be noted that, in one embodiment, the first touch electrode 422 is a driving electrode, and the second touch electrode 423 is a sensing electrode. In some embodiments, the first touch electrode 422 may also be a sensing electrode, and the second touch electrode 423 may also be a driving electrode, which is not limited herein.

In addition, in some embodiments, the binding component 421 and the bridge 43 may also be formed on the same level layer, which is not limited herein.

In some embodiments, the interface between a part of the second inorganic layer 41 disposed on the bonding area 10C and the first inorganic layer 11 is a rough surface.

In one embodiment, after the first inorganic layer 11 is formed, specifically, after the interlayer dielectric layer 118 is formed, an etching process may be used to form a rough structure on the surface of the interlayer dielectric layer 118, for example, it may be an uneven microstructure, and the contact area between the first inorganic layer 11 and the second inorganic layer 41 is increased, which improves the adhesion between the first inorganic layer 11 and the second inorganic layer 41, and further reduces the risk of falling off after the driving component 50 is bound.

In one embodiment, a via hole 41A is formed on a part of the second inorganic layer 41 corresponding to the signal line 12. The signal line 12 is exposed through the via hole 41A. The binding component 421 is electrically connected to the signal line 12 through the via hole 41A.

Figure 4:
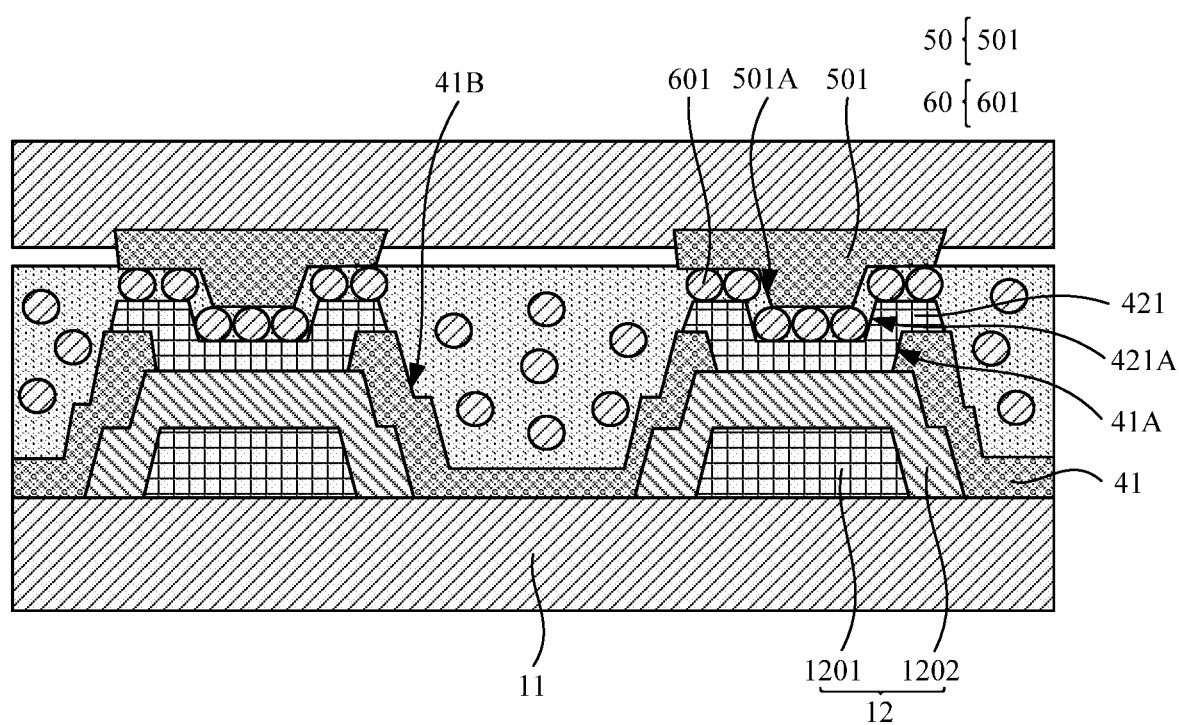
FIG. 4 a schematic structural diagram of the display panel according to one embodiment of the present invention when the driving component and the binding component are bound.

Referring to FIG. 4, the display panel 100 also comprises a conductive paste 60. The driving component 50 comprises a plurality of connection terminals 501. The conductive paste 60 is provided between the connection terminal 501 and the binding component 421. A groove 421A is formed on the binding component 421. The connection terminal 501 comprises a convex part 501A. The convex part 501A matches the groove 421A.

The conductive paste 60 comprises a plurality of conductive particles 601. The connection terminal 501 is electrically connected to the binding component 421 in the driving component 50 through the conductive particles 601.

Optionally, the driving component 50 may also be a flexible circuit board or other peripheral circuits. In one embodiment, the driving component 50 is a flexible circuit board, and a driving chip (not shown in the drawings) is formed on the flexible circuit board.

Specifically, in one embodiment, the groove 421A on the binding component 421 is formed by etching processes. The groove 421A may increase the ability of the binding component 421 to capture the conductive particles 601, thereby increasing the stability of the electrical connection between the binding component 421 and the connection terminal 501 during binding pressing processes.

In some embodiments, the groove 421A of the binding component 421 is naturally formed in the via hole 41A of the second inorganic layer 41.

It should be noted that, by adjusting the ratio of the aperture of the via hole 41A to the size of the binding component 421, a part of the conductive layer 42 disposed on the bonding area 10C may directly form the binding component 421 with a sunk structure in the via hole 41A, that is, the groove 421A is naturally formed in the binding component 421. For example, if the ratio of the projected area of the binding component 421 on the plane of the first inorganic layer 11 to the projected area of the via hole 41A on the plane of the first inorganic layer 11 is in the range of 10:9 to 10:3, the area corresponding to the via hole 41A naturally forms a groove 421A by adjusting the aperture of the via hole 41A when the binding component 421 covers the via hole 41A. When the size of the groove 421A is large enough, the binding component 421 may capture more conductive particles 601, thereby increasing the electrical connection stability between the binding component 421 and the connection terminal 501, and further improves the stability of the signal transmission between the flexible circuit board and the binding component 421.

In one embodiment, the via hole 41A corresponds to the middle area of the binding component 421, the groove 421A is formed in the middle area of the binding component 421. As a result, the surrounding wall thickness of the groove 421A is balanced, which improves the stability of the connection between the binding component 421 and the connection terminal 501 during the hot-press bonding is improved.

Referring to FIG. 4, in one embodiment, by removing the organic layer in the non-conductive layer, a sunk structure 41B is formed on a part of the second inorganic layer 41 disposed between the adjacent binding components 421. When the connection terminal 501 and the binding component 421 in the flexible circuit board are bound and pressed, the conductive particles 601 disposed between the adjacent binding components 421 tend to fall into the sunk structure 41B, thereby reducing the number of conductive particles 601 between adjacent binding components 421, and reducing the risk of short-circuiting between adjacent binding components 421.

In one embodiment, in the display panel 100, the second planarization layer 122 of the non-conductive layer in the bonding area 10C is removed, so that the second inorganic layer 41 of the conductive structure layer 40 in the non-conductive layer directly contacts with the first inorganic layer 11 of the thin film transistor functional layer 10. Due to the good adhesion between the inorganic layers, the adhesion between the layers in the non-conductive is enhanced, thereby further reducing the probability of falling off after the flexible circuit board is bound to the binding component 421, and improving the product yield of the display panel.

In one embodiment, a display device comprises a display panel, and the specific structure of the display panel can refer to the description of the display panel 100 described above, and the details are not described herein.

As compared to the display panel in the prior art, the display panel of the present invention is formed by removing the organic layer of the non-conductive layer in the bonding area, so that the second inorganic layer of the non-conductive layer directly contacts with the first inorganic layer of the thin film transistor functional layer in the non-conductive layer. Due to the good adhesion between the inorganic layers, the adhesion between the non-conductive layers is enhanced, thereby reducing the probability of falling off after the flexible circuit board and the binding component are bound, and improving the product yield of the display panel.

In the above, the present invention has been described in the above preferred embodiments, but the preferred embodiments are not intended to limit the scope of the invention, and a person skilled in the art may make various modifications without departing from the spirit and scope of the invention. The scope of the present invention is determined by claims.

What is claimed is:

1. A display panel, comprising:
a bonding area, wherein the bonding area is configured to bind and connect with a flexible circuit board;
a thin film transistor functional layer, wherein a part of the thin film transistor functional layer disposed in the bonding area comprises a first inorganic layer and a plurality of signal lines disposed on the first inorganic layer; and
a conductive structure layer, wherein the conductive structure layer is disposed on the plurality of signal lines, the conductive structure layer comprises a second inorganic layer and a conductive layer disposed in order, and a part of the second inorganic layer located in the bonding area is disposed on the plurality of signal lines and is directly disposed on the first inorganic layer, and a part of the conductive layer located in the bonding area comprises a plurality of binding components, and each of the plurality of binding components is correspondingly disposed above the plurality of signal lines, and the plurality of binding components are electrically connected to the plurality of signal lines, and an interface between a part of the second inorganic layer disposed in the bonding area and the first inorganic layer is a rough surface.

2. The display panel according to claim 1, wherein the display panel comprises a plurality of via holes, each of the plurality of via holes is defined on a part of the second inorganic layer corresponding to one of the plurality of signal lines, and the plurality of via holes expose the plurality of signal lines, and the plurality of binding components are electrically connected to the plurality of signal lines through the plurality of via holes.

3. A display panel, comprising:
a bonding area, wherein the bonding area is configured to bind and connect with a driving component;
a thin film transistor functional layer, wherein a part of the thin film transistor functional layer disposed in the bonding area comprises a first inorganic layer and a plurality of signal lines disposed on the first inorganic layer; and
a conductive structure layer, wherein the conductive structure layer is disposed on the plurality of signal lines, the conductive structure layer comprises a second inorganic layer and a conductive layer disposed in order, and a part of the second inorganic layer located in the bonding area is disposed on the plurality of signal lines and is directly disposed on the first inorganic layer, and a part of the conductive layer located in the bonding area comprises a plurality of binding components, and each of the plurality of binding components is correspondingly disposed above the plurality of signal lines, and the plurality of binding components are electrically connected to the plurality of signal lines.

4. The display panel according to claim 3, wherein an interface between a part of the second inorganic layer disposed in the bonding area and the first inorganic layer is a rough surface.

5. The display panel according to claim 3, further comprising a display area, wherein a part of the conductive structure layer disposed in the display area comprises a plurality of bridges, the second inorganic layer comprises a first sub-inorganic layer and a second sub-inorganic layer disposed in order, and each of the plurality of bridges is disposed between the first sub-inorganic layer and the second sub-inorganic layer, and a part of the conductive layer disposed in the display area further comprises a plurality of first touch electrodes and a plurality of second touch electrodes disposed on the same level layer, and adjacent the plurality of first touch electrodes are electrically connected to each other through the plurality of bridges; and wherein the plurality of binding components and the plurality of first touch electrodes are disposed on the same level layer.

6. The display panel according to claim 5, further comprising an organic light-emitting layer and a packaging layer disposed on the thin film transistor functional layer in order, wherein the first inorganic layer is disposed on the packaging layer.

7. The display panel according to claim 3, wherein the first inorganic layer comprises a substrate, a buffer layer, a gate insulating layer, and an interlayer dielectric layer disposed in order, wherein a part of the second inorganic layer disposed in the bonding area covers the interlayer dielectric layer.

8. The display panel according to claim 7, wherein the thin film transistor functional layer comprises an active layer, a gate metal layer, a first source/drain metal layer, and a second source/drain metal layer disposed in order;

wherein the active layer is disposed on the buffer layer, the gate insulating layer is disposed on the active layer, the gate metal layer is disposed on the gate insulating layer, the interlayer dielectric layer is disposed on the gate metal layer, and the first source/drain metal layer is disposed on the interlayer dielectric layer; and wherein each of the plurality of signal lines comprises a first sub-signal line and a second sub-signal line disposed on the first inorganic layer in order, the first sub-signal line and the first source/drain metal layer are disposed on the same level layer, and the second sub-signal line and the second source/drain metal layer are disposed on the same level layer.

9. The display panel according to claim 3, wherein the display panel comprises a plurality of via holes, each of the plurality of via holes is defined on a part of the second inorganic layer corresponding to each of the plurality of signal lines, and the plurality of via holes exposes the plurality of signal lines, and the plurality of binding components are electrically connected to the plurality of signal lines through the plurality of via holes.

10. The display panel according to claim 9, further comprising a conductive glue, wherein the driving component comprises a plurality of connection terminals, and the conductive glue is disposed between the plurality of connection terminals and the plurality of binding components; and wherein a groove is defined on the plurality of binding components, and the plurality of connection terminals comprise a convex part, and the convex part matches with the groove.

11. The display panel according to claim 3, wherein the driving component is a flexible circuit board.

12. A display device, comprising a display panel;
wherein the display panel comprises:
a bonding area, wherein the bonding area is configured to bind and connect with a driving component;
a thin film transistor functional layer, wherein a part of the thin film transistor functional layer disposed in the bonding area comprises a first inorganic layer and a plurality of signal lines disposed on the first inorganic layer; and
a conductive structure layer, wherein the conductive structure layer is disposed on the plurality of signal lines, the conductive structure layer comprises a second inorganic layer and a conductive layer disposed in order, and a part of the second inorganic layer located in the bonding area is disposed on the plurality of signal lines and is directly disposed on the first inorganic layer, and a part of the conductive layer located in the bonding area comprises a plurality of binding components, and each of the plurality of binding components is correspondingly disposed above the plurality of signal lines, and the plurality of binding components are electrically connected to the plurality of signal lines.

13. The display device according to claim 12, wherein an interface between a part of the second inorganic layer disposed in the bonding area and the first inorganic layer is a rough surface.

14. The display device according to claim 12, further comprising a display area, wherein a part of the conductive structure layer disposed in the display area comprises a plurality of bridges, the second inorganic layer comprises a first sub-inorganic layer and a second sub-inorganic layer disposed in order, and each of the plurality of bridges is disposed between the first sub-inorganic layer and the second sub-inorganic layer, and a part of the conductive layer disposed in the display area further comprises a plurality of first touch electrodes and a plurality of second touch electrodes disposed on the same level layer, and adjacent the plurality of first touch electrodes are electrically connected to each other through the plurality of bridges; and wherein the plurality of binding components and the plurality of first touch electrodes are disposed on the same level layer.

15. The display device according to claim 14, further comprising an organic light-emitting layer and a packaging layer disposed on the thin film transistor functional layer in order, wherein the first inorganic layer is disposed on the packaging layer.

16. The display device according to claim 12, wherein the first inorganic layer comprises a substrate, a buffer layer, a gate insulating layer, and an interlayer dielectric layer disposed in order, wherein a part of the second inorganic layer disposed in the bonding area covers the interlayer dielectric layer.

17. The display device according to claim 16, wherein the thin film transistor functional layer comprises an active layer, a gate metal layer, a first source/drain metal layer, and a second source/drain metal layer disposed in order;

wherein the active layer is disposed on the buffer layer, the gate insulating layer is disposed on the active layer, the gate metal layer is disposed on the gate insulating layer, the interlayer dielectric layer is disposed on the gate metal layer, and the first source/drain metal layer is disposed on the interlayer dielectric layer; and wherein each of the plurality of signal lines comprises a first sub-signal line and a second sub-signal line disposed on the first inorganic layer in order, the first sub-signal line and the first source/drain metal layer are disposed on the same level layer, and the second sub-signal line and the second source/drain metal layer are disposed on the same level layer.

18. The display device according to claim 12, wherein the display device comprises a plurality of via holes, each of the plurality of via holes is defined on a part of the second inorganic layer corresponding to one of the plurality of signal lines, and the plurality of via holes expose the plurality of signal lines, and the plurality of binding components are electrically connected to the plurality of signal lines through the plurality of via holes.

19. The display device according to claim 18, wherein the display device comprises a plurality of via holes, each of the plurality of via holes is defined on a part of the second inorganic layer corresponding to one of the plurality of signal lines, and the plurality of via holes exposes the plurality of signal lines, and the plurality of binding components are electrically connected to the plurality of signal lines through the plurality of via holes.

20. The display device according to claim 12, wherein the driving component is a flexible circuit board.

\* \* \* \* \*